(12) United States Patent
Simpson et al.

(10) Patent No.: US 6,320,644 B1
(45) Date of Patent: Nov. 20, 2001

(54) RETICLE ALIGNMENT SYSTEM FOR USE IN LITHOGRAPHY

(76) Inventors: Craig R. Simpson, R.R.1, Box 95, TH90, Danville, VT (US) 05828; Marc S. Lucas, 56 Throne Hill Rd., Groton, MA (US) 01450

( * ) Notice: Subject to any disclaimer, the term of this patent is extended or adjusted under 35 U.S.C. 154(b) by 0 days.

(21) Appl. No.: 08/228,889

(22) Filed: Apr. 18, 1994

(51) Int. Cl.[7] .................................................. G03B 27/42
(52) U.S. Cl. .................................................................. 355/53
(58) Field of Search ............................... 355/53, 72, 75

(56) References Cited

U.S. PATENT DOCUMENTS

| | | | |
|---|---|---|---|
| 4,901,109 | * | 2/1990 | Mitome et al. .................... 355/53 X |
| 4,937,018 | * | 6/1990 | Ayata et al. ...................... 355/53 X |
| 4,999,669 | * | 3/1991 | Sakamoto et al. ................... 355/53 |
| 5,105,025 | * | 4/1992 | Ohta et al. ........................ 355/53 X |
| 5,148,214 | * | 9/1992 | Ohta et al. ........................ 355/53 X |
| 5,262,822 | * | 11/1993 | Kosugi et al. ..................... 355/53 |
| 5,272,501 | * | 12/1993 | Nishi et al. ....................... 355/53 |
| 5,281,996 | * | 1/1994 | Pruning et al. ..................... 355/77 |
| 5,309,197 | * | 5/1994 | Mori et al. ........................ 355/53 |
| 5,331,371 | * | 7/1994 | Mori et al. ........................ 355/53 |

* cited by examiner

*Primary Examiner*—Christopher E. Mahoney
(74) *Attorney, Agent, or Firm*—Hamilton, Brook, Smith & Reynolds, P.C.

(57) ABSTRACT

Misalignment errors in a lithographic system resulting from the effect of environmental changes on the lens system itself are detected and corrected. A fiducial on the reticle adjacent to its working area is projected through the lens. A metrology plate carried by the lens holds reference mirrors and detectors. The reference mirrors receive the resultant image and reflect it to detectors in a reflected image plane. This provides feedback to the reticle alignment system as to the extent of misalignment, if any. Correction is made by moving the reticle until alignment is achieved and detected. This motion is achieved by using a reticle chuck with linear motors.

3 Claims, 2 Drawing Sheets

RETICLE ALIGNMENT SYSTEM FOR USE IN LITHOGRAPHY

GOVERNMENT FUNDING

This invention was made with Government support under Contract No. F33615-92-C-5805 awarded by the United States Air Force. The Government has certain rights in the invention.

FIELD OF THE INVENTION

The invention relates to a through-the-lens alignment system for use in lithography. In particular, it relates to a system which corrects for alignment errors occurring in the optical system due to the effect of environmental changes, such as change in temperature or atmospheric pressure.

BACKGROUND OF THE INVENTION

One problem in lithography is knowing the position relationship between the camera image and the substrate position.

Present lithographic alignment systems achieve alignment by referencing a fiducial in the reticle to a position of the stage. This assumes that the camera remains stable after the alignment and doesn't drift due to the effect of environmental conditions on the lens system; and, as a result, it provides no assurance that the image doesn't move between alignments, creating a misalignment.

In the present invention, alignment is through the lens, with fiducials in the reticle being projected through the lens system and being aligned with sensors carried by the lens and using a reflected image plane, not the image plane on the stage or substrate.

BRIEF SUMMARY OF THE INVENTION

This invention is directed to correcting misalignment errors resulting from changes in the lens system itself. These errors can arise from factors such as temperature change or change in atmospheric pressure A fiducial on the reticle adjacent to its working area is projected through the lens, using a wavelength of light that is compatible with the lens. A metrology plate carried by the lens itself has fold mirrors to receive the resultant image and reflect it to detectors in a reflected image plane. This provides feedback to the reticle alignment system. Thus, if environmental conditions associated with the lens create a misalignment due to camera problems, the extent of the change is detected and continuously corrected.

Since the misalignment is not related to the stage, and is not detected at the stage, it is not corrected by moving the stage. Rather, correction is made by moving the reticle until alignment is achieved and detected. This motion is achieved by having a reticle stage with linear motors to move the reticle until alignment is achieved.

DETAILED DESCRIPTION OF THE INVENTION

Figure 1:
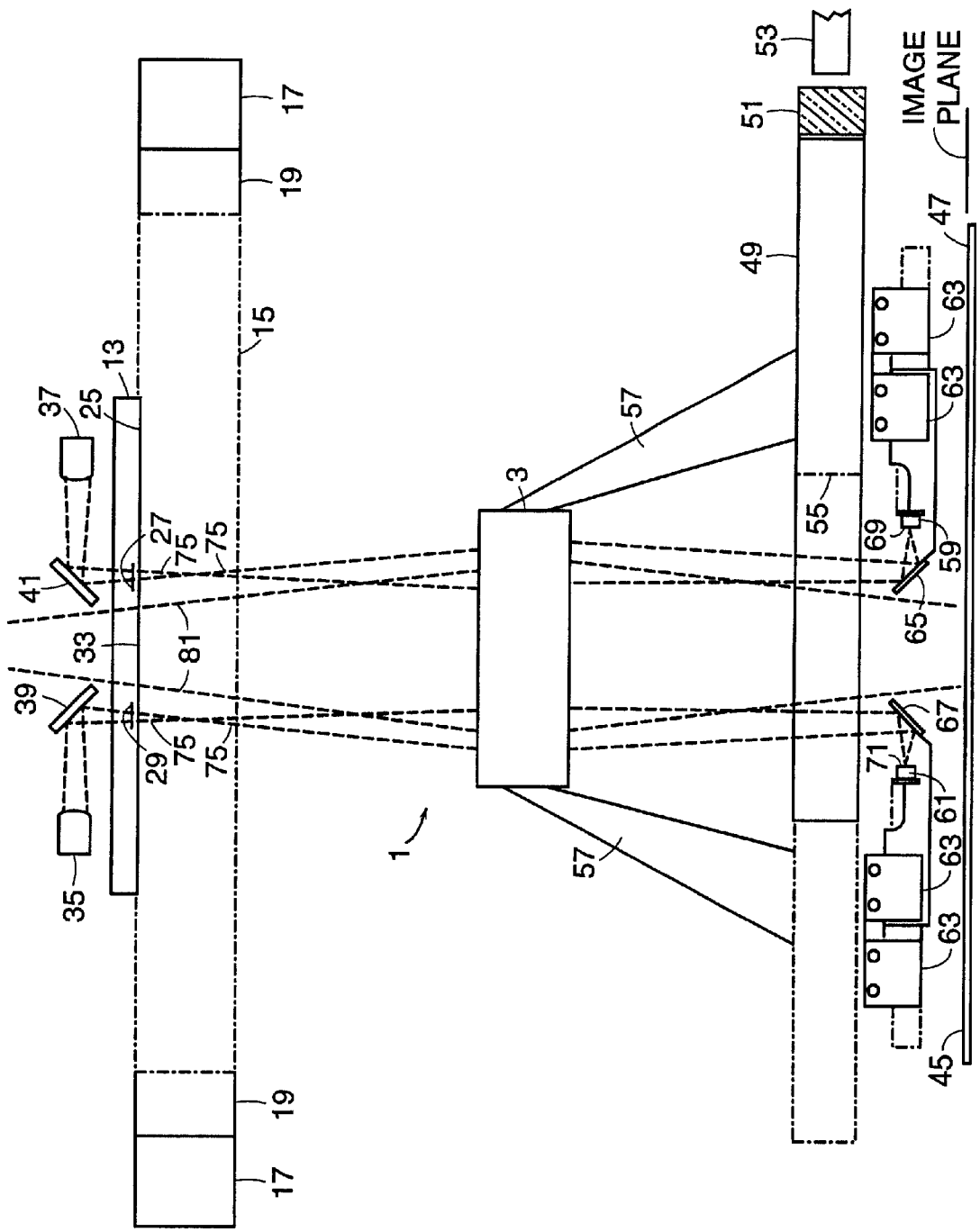
FIG. 1 is a front elevation showing the system.
Figure 2:
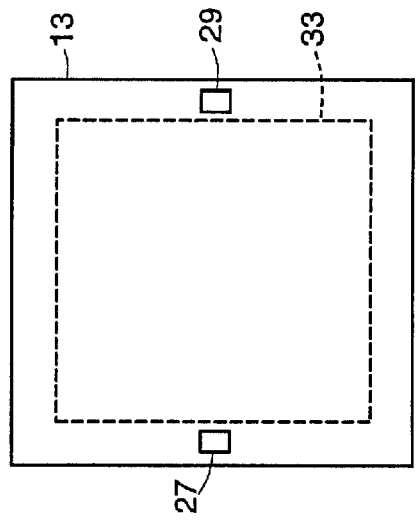
FIG. 2 is a plan view of a reticle showing fiducial marks.

In this system fiducial marks on the reticle, but outside of the working pattern to be projected, are projected through the regular lens system, but at the periphery. These projected images are reflected by folding mirrors mounted on the lens itself and focussed on detectors in the reflected image plane. These detectors are capable of measuring the position of the relayed alignment fiducials. Determination of whether or not the projected images of the fiducial marks are in proper alignment, and correction for misalignment, are achieved in the usual manner.

If, due to environmental factors, such as temperature change or atmospheric pressure change, misalignment occurs, the error is detected and corrected immediately. Correction is made by moving the reticle in the correct direction until alignment is achieved as determined by the detectors. As will be appreciated, this avoids the normal system for environmental correction, i.e., periodically stopping production and realigning the stage, and provides continuous correction.

The system includes a normal optical system, such as system 1, with lens 3. Reticle 13 is carried by reticle chuck 15 which has a supporting frame 17 and linear motors 19 for positioning the "These linear motors serve as reticle alignment means to align the reticle chuck." reticle. Linear motors are shown for x-direction correction, but similar motors can also be used for positioning in the y-, z-, and θ-directions. The reticle 13 carries fiducial (alignment) marks 27 and 29 and the working pattern 33 to be projected. These are in the object plane 25 of lens 3. A pair of marks 27 and 29 reference ing the x- and y-directions are shown. A description of one system of linear motors for positioning a reticle will be found in Resor et al. U.S. Pat. No. 4,769,680.

Light sources 35 and 37, such as light pipes, project light beams to folding mirrors 39 and 41 which reflect the beams to the fiducial marks 27 and 29. This serves to project images of the fiducial marks through the peripheral areas of the lens 3 of the optical system 1. The light used should be of a wavelength compatible with the lens system, and preferably of the same wavelength as the light source used to project the pattern itself. "These light sources serve as illumination means for illuminating the fiducial marks and projecting images through the lens."

Substrate 45, with image plane 47, is carried on a stage below the lens. It receives an Image of pattern 33.

A metrology plate 49, made of a thermally and mechanically stable material such as Invar, is mounted on the lens system itself, slightly below it, by means of mounting members 57. Plate 49 has an opening 55 to permit passage of the rays associated with both the pattern and fiducial images. A pair of detectors 59 and 61 are secured in position by mounting brackets 63 carried by metrology plate 49. Thus, to the extent that the optical system 1 is affected by environmental factors, the detectors will be similarly moved, and reflect the changes in the optical system. The position of plate 49 is monitored by mirror 51 reflecting a beam from interferometer 53, which is also used to monitor the position of the substrate. This, of course, can be done in both x- and y-directions Each of the detectors 59 and 61 has an associated folding mirror 65 and 67, respectively. These mirrors are also carried by brackets 63, and are positioned just below opening 55 and in the path of the images of the fiducial marks 27 and 29, respectively (but outside of the path of the pattern image). As a result, the images of the marks will be reflected to their respective detectors.

The detectors, in turn, are positioned at the image planes 69 and 71 of the fiducial marks. Accordingly, when the system is in alignment, the fiducial images will be in focus at the detectors; when misaligned due to environmental factors, the detectors will show this misalignment and its extent. Information as to such misalignment, and its extent, is fed back to the reticle alignment system, i.e., linear motors 19, so that correction can be made by them. Once aligned, this fact will be determined by the detectors, and corrective measures will cease.

"This feeding back of such information to the reticle alignment system serves as a feedback system operatively associating the detectors with the alignment means."

Figure 3:
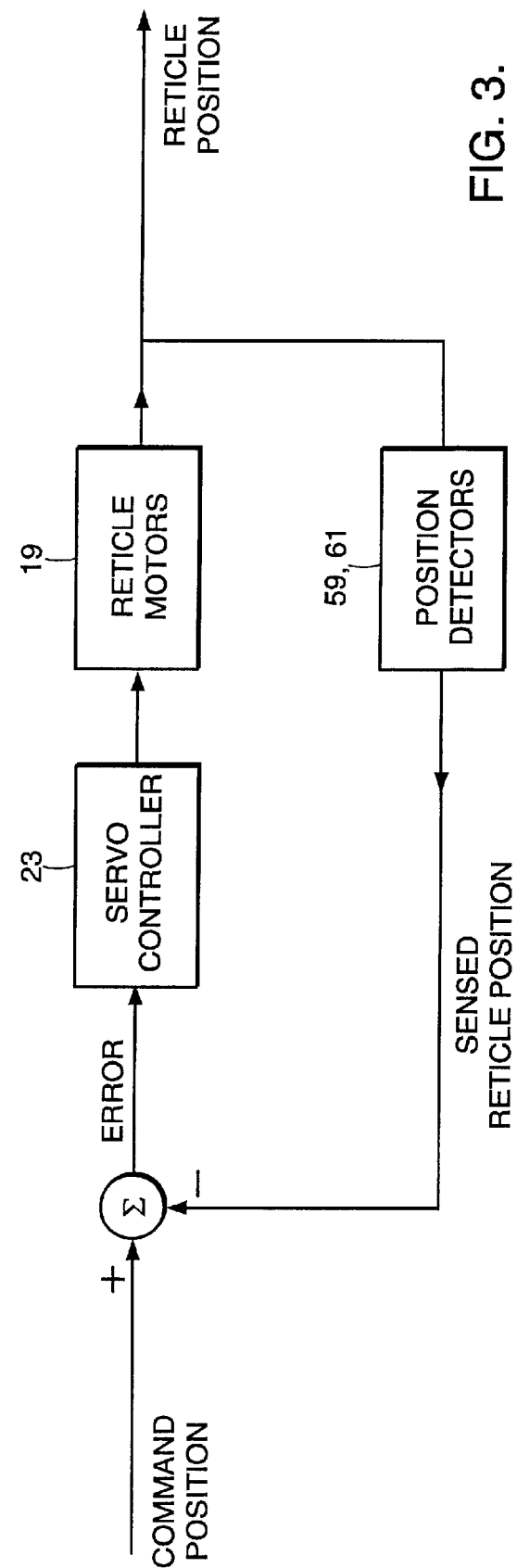
FIG. 3 is a flow chart showing the reticle alignment system.

FIG. 3 shows a flow chart for reticle alignment. A closed loop servo 23 controls the position of the reticle 13 with respect to the detectors 59 and 61. Any positional error goes to the servo controller which controls the reticle motors, re-aligning the reticle.

Various systems of alignment marks and detectors can be used to detect misalignment and correct for it. Examples will be found in the above Resor patent and in Holbrook et al. U.S. Pat. No. 4,855,792. These can be used with the present invention.

It can be seen, therefore, that errors due to environmental factors affecting the lens system are continuously monitored and corrected.

As stated, the images of the fiducial marks go through the peripheral areas of the lens. The extreme rays of these marks are identified at 75, with the image 77 appearing at the image planes 69 and 71 of the detectors. Similarly, the extreme rays 81 of the pattern image pass through the more central area of the lens, and form image 83 on image plane 47 of the substrate. The mirrors are so positioned as to prevent images of the fiducial marks from reaching the substrate and exposing it; but they do not interfere with the image of the working pattern from reaching the substrate.

We claim:

1. A lithographic alignment system to correct misalignments resulting from environmental effects on the lens which are unrelated to stage position, said alignment system compromising:

a lens for projecting images from an object plane to an image plane;

a reticle, a reticle chuck to hold said reticle in said object plane, linear motors to align said reticle chuck and thereby align said reticle, said reticle bearing a working pattern and a first pair of fiducial marks positioned on opposite sides of said working pattern, illumination means for illuminating said fiducial marks and projecting images thereof through said lens;

a pair of folding mirrors secured to said lens and positioned to receive and reflect said images, a detector associated with each said mirror, carried by said lens, and positioned to receive said reflected images, said detectors being in planes which are reflections by said mirrors of said image plane; and a feedback system operatively associating said detectors with said linear motors, whereby misalignment caused by environmental changes in said lens can be detected and corrected.

2. A lithographic alignment system to correct misalignments resulting from environmental effects on the lens which are unrelated to stage position, said alignment system comprising:

a lens for projecting images from an object plane to an image plane;

a reticle, a reticle chuck to hold said reticle in said object plane, alignment means to align said reticle chuck and thereby align said reticle, said reticle bearing a working pattern and a first pair of fiducial marks positioned on opposite sides of said working pattern, illumination means for illuminating said fiducial marks and projecting images thereof through said lens;

a pair of folding mirrors secured to said lens and positioned to receive and reflect said images, a detector associated with each said mirror, carried by said lens, and positioned to receive said reflected images, said detectors being in planes which are reflections by said mirrors of said image plane;

a metrology plate, said metrology plate being used to secure said mirrors and said detectors to said lens; and a feedback system operatively associating said detectors with said alignment means, whereby misalignment caused by environmental changes in said lens can be detected and corrected.

3. A lithographic alignment system to correct misalignments resulting from environmental effects on the lens which are unrelated to stage position, said alignment system, comprising:

a lens for projecting images from an object plane to an image plane;

a reticle, a reticle chuck to hold said reticle in said object plane, alignment means to align said reticle chuck and thereby align said reticle, said reticle bearing a working pattern and a first pair of fiducial marks positioned on opposite sides of said working pattern, illumination means for illuminating said fiducial marks and projecting images thereof through said lens;

a pair of folding mirrors secured to said lens and positioned to receive and reflect said images, a detector associated with each said mirror, carried by said lens, and positioned to receive said reflected images, said detectors being in planes which are reflections by said mirrors of said image plane, said mirrors being positioned so as to prevent said images of said fiducial marks from being projected to an underlying substrate; and a feedback system operatively associating said detectors with said alignment means, whereby misalignment caused by environmental changes in said lens can be detected and corrected.

* * * * *

UNITED STATES PATENT AND TRADEMARK OFFICE
CERTIFICATE OF CORRECTION

PATENT NO. : 6,320,644 B1
DATED : November 20, 2001
INVENTOR(S) : Craig R. Simpson and Mark S. Lucas It is certified that error appears in the above-identified patent and that said Letters Patent is hereby corrected as shown below:

Column 3,
Line 39, "compromising" should read -- comprising --

Signed and Sealed this

Second Day of April, 2002

Attest:

*Attesting Officer*

JAMES E. ROGAN
*Director of the United States Patent and Trademark Office*